Figure 1:
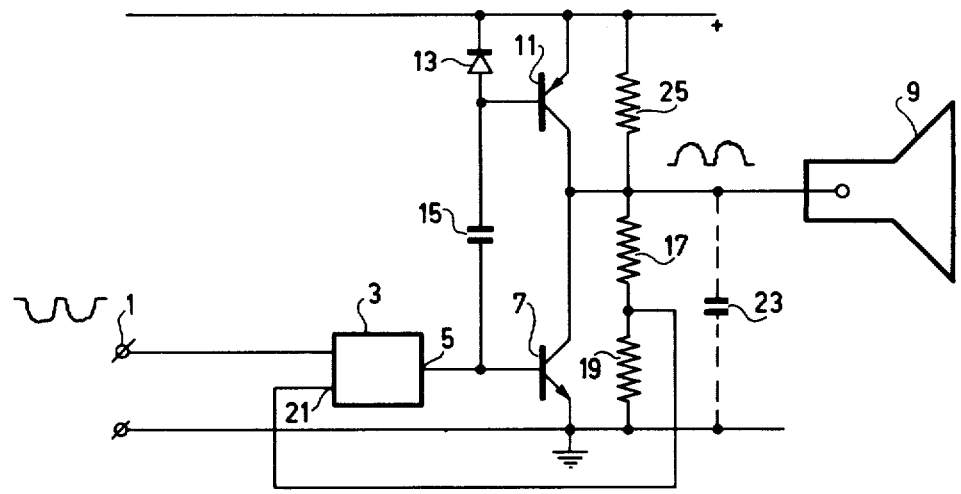

United States Patent
Teuling

[11] 4,035,840
[45] July 12, 1977

[54] TELEVISION DISPLAY APPARATUS HAVING A VIDEO AMPLIFIER

[75] Inventor: Dirk Johan Adriaan Teuling, Eindhoven, Netherlands

[73] Assignee: U.S. Philips Corporation, New York, N.Y.

[21] Appl. No.: 633,285

[22] Filed: Nov. 19, 1975

[30] Foreign Application Priority Data

Dec. 18, 1974 Netherlands .................. 7416481

[51] Int. Cl.² .................. H04N 5/14; H03F 3/183
[52] U.S. Cl. .................. 358/184; 330/13
[58] Field of Search ....... 178/7.5 R, 7.5 DC, 7.3 R, 178/7.3 DC; 358/39, 184, 242; 330/13, 15, 24-26

[56] References Cited
U.S. PATENT DOCUMENTS
3,070,656 12/1962 Wiencek .................. 178/7.5 R OTHER PUBLICATIONS
Turner, "Diodes Eliminate Crossover Distortion in Video Amplifier," *Electronics*, Jan. 19, 1920 p. 92.

*Primary Examiner* — John C. Martin
*Attorney, Agent, or Firm* — Frank R. Trifari; Henry I. Steckler

[57] ABSTRACT

Through a provision of a bias voltage, with the aid of a diode to the base of a transistor of a complementary pair, which transistor is controlled via a small capacitance, a video output amplifier having a very slight dissipation can be obtained.

7 Claims, 2 Drawing Figures

TELEVISION DISPLAY APPARATUS HAVING A VIDEO AMPLIFIER

The invention relates to a television display apparatus having a video amplifier which comprises a pair of active elements whose output electrodes of a high output impedance are coupled to one another and to a control electrode of a picture display tube whilst a control electrode of one of the active elements can be driven via a capacitor by a signal of high video frequencies only.

From FIG. 5 of U.S. Pat. No. 2,938,946 a television receiver having such a video amplifier is known in which the active elements are pentodes, one of which is controlled via the capacitor by high-frequency signals only and the other by signals which also comprise low frequencies the output electrodes of a high output impedance are the anodes. The load resistors of the pentodes have been chosen of such a value (56 kOhm) that a power source control of the picture display tube is obtained. The load resistors are connected to a very high supply voltage (1000 V) so that yet a sufficiently large quiescent current flows through the pentodes. The dissipation of the circuit is very large.

It is an object of the invention to provide a picture display apparatus as mentioned above whose dissipation is extremely low.

According to the invention such a picture display apparatus is therefore characterized in that the active elements are formed by a complementary pair of transistors which are connected in series and whose collectors are coupled to the control electrode of the picture display tube, whilst the base of one of the transistors is controlled via the said capacitor, which base is furthermore connected via a diode to such a potential that in the absence of a signal substantially no direct current flows through this transistor whilst the polarity of the diode is such that after a possible change in charge of the capacitor due to a signal jump which has made the base-emitter junction of this transistor conductive, the said change in charge can be cancelled by an opposite signal jump which makes the diode conductive whilst furthermore the quiescent state of the other transistor is substantially currentless and in that a voltage feedback is applied from an output of the amplifier to an input.

The transistors only carry current when controlled by a video signal so that the dissipation can remain small. By means of the feedback it is achieved that the distortion remains slight and that the picture display tube is energized in the usual suitable, for the gamma correction in the transmitter. The use of the diode makes it possible to render the quiescent state of the transistor, which is controlled via the capacitor substantially currentless as now no resistive network need be connected to the base of the transistor for exchanging the charge of the capacitor.

Figure 2:
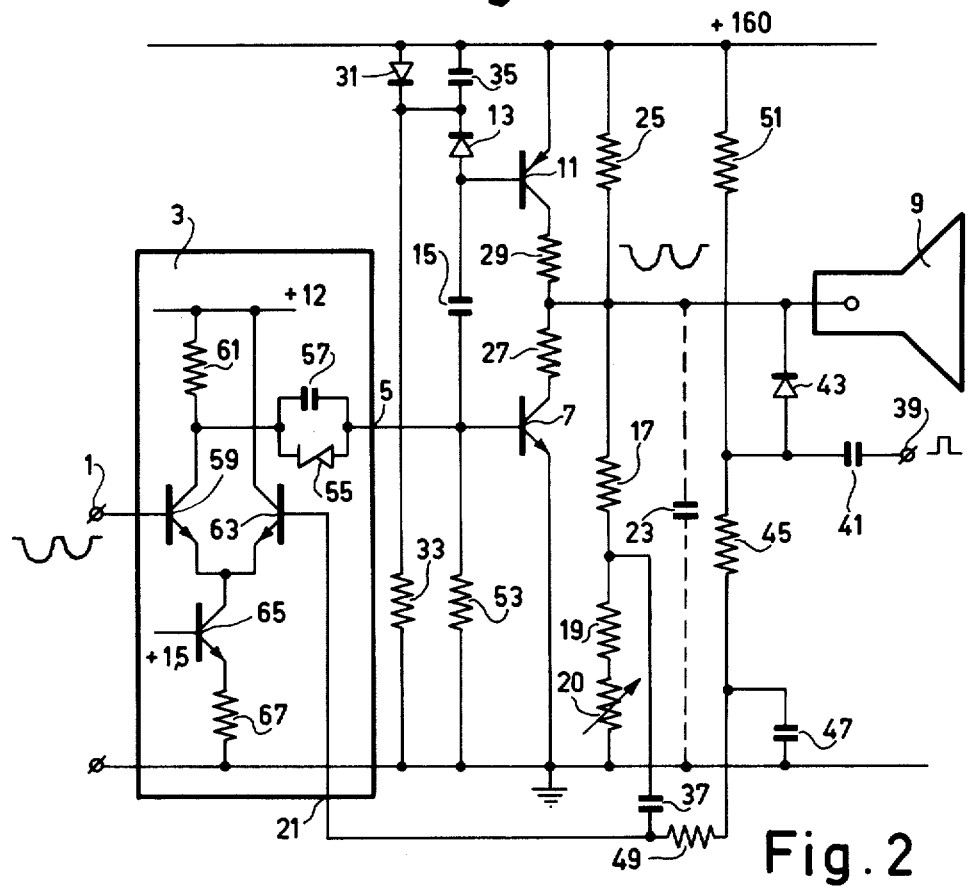

The invention will now be further explained with reference to the drawing. In the drawing:

FIG. 1 shows by means of a concise circuit diagram the principle of a circuit according to the invention and FIG. 2 shows by means of a circuit diagram a favourable embodiment of a circuit according to the invention.

In FIG. 1 a video signal to be displayed is supplied to an input 1 of a pre-amplifier 3. An output 5 of the pre-amplifier 3 is connected to the base of an npn transistor 7 whose emitter is connected to earth and the collector to a control electrode, in this case the cathode of a picture display tube 9, and furthermore to the collector of a pnp transistor 11.

The transistor 11 forms a complementary pair with the transistor 7. Of the transistor 11 the emitter is connected to a positive power supply and the base 13 to the emitter via a diode. For high frequencies the base is controlled via a capacitor 15 whose other end is also connected to the output 5 of the pre-amplifier 3.

From the junction of the collectors of the transistors 7 and 11 a voltage divider is connected to earth which is formed by two resistors 17 and 19. The junction of these resistors is connected to a feedback signal input 21 of the pre-amplifier 3.

Furthermore, connected to the collectors there is a capacitance 23 which represents the substantially exclusive capacitive load of the control electrode of the picture display tube together with its wiring capacitances on the collectors and a resistor 25 to the positive power supply.

The circuit operates as follows. In the absence of a signal at the input 1 the transistor 7 is kept in a substantially blocked state by the DC voltage which is found at the input 21 of the pre-amplifier and which is derived from the voltage divider 17, 19. The transistor 11 is also substantially blocked as its base receives no bias voltage.

Driving the input 1 of the preamplifier 3 by a video signal just the positive-going signal parts are produced at the base of the transistor 7, so that this transistor will draw sufficient current to decrease the charge of the capacitance 23 with a speed which is suitable for any slope of the input signal. The transistor 11 then remains blocked. By negative-going signal parts a decrease in current occurs through the transistor 7 which cannot increase the charge of the capacitor 23. This would be possible if the resistor 25 of the common collectors to the positive supply voltage would have a usual small value. However, this resistor would then show a large dissipation at low collector voltages. It is ensured that at the negative-going signal parts the capacitor 23 is rapidly recharged via the transistor 11, thus making a very large value of the resistance 25 sufficient. Then the transistor 11 only dissipates during the occurrence of rapid negative-going signal parts at the output 5 of the pre-amplifier 1.

In case of a negative-going signal jump any increase of the charge of the capacitor 15 caused by means of the base current of the transistor 11. Owing to the diode 13 this increase in charge is, however cancelled out again at a positive-going signal jump. The diode 13 conducts only at these positive-going signal parts.

In order to obtain a uniform distribution of the dissipation over the transistors 7 and 11 the value of the resistor 25 is made approximately equal to that of the voltage divider 17, 19. This value is further only determined by the requirements which must be made on the voltage divider 17, 19 for the feedback and may, for example, be 56 kOhm so that the dissipation in the resistor 25 is very low.

If negative-going signal parts occur it may be necessary that the base voltage of the transistor 7 must be slightly negative to obtain a distortion-free output voltage. This should be taken into account when rating the circuit.

It will be clear that it is possible to interchange the functions of the transistors when the circuit is correspondingly modified.

If so desired, to prevent that the capacitor gets an undesired charge a pulse of such a polarity can be applied to the output of the amplifier in each flyback period that, via the feedback path a signal is produced which renders the diode 13 conductive.

In FIG. 2 corresponding elements have the same reference numerals as in FIG. 1. Broadly speaking the operation of the circuit is also the same as that of FIG. 1. The differences will now be discussed.

In order to make the dissipation in the circuit still lower, the junctions of the collectors of the transistors 7 and 11 include resistors 27, 29 of, for example 1 kOhm whose effect on the output voltage which is produced at the cathode of the picture display tube 9 is small but which limit the collector voltages during the occurrence of charge- and discharge currents for the capacitor 23.

Furthermore a slight bias voltage is applied to the side of the diode 13 which faces away from the base of the transistor 11, to decrease take over distortion, i.e. distortion which is produced if the transistor 11 must start drawing current and the transistor 7 is just blocked. This bias voltage is obtained by means of a diode 31 through which a current is passed by means of a resistor 33. Connected in parallel with the diode 31 is a capacitor 35 which keeps the voltage across the diode constant also when the diode 13 is conducting.

The feedback in the circuit is separated for AC voltage and DC voltage. A capacitor 37 between the junction of the resistors 17 and 19 and the feedback signal input 21 of the preamplifier 3 caters for the AC voltage feedback, the voltage divider 17, 19 being extended with a variable resistor 20 to allow adjustment of the AC voltage amplification of the circuit. The DC voltage feedback is effected such that DC voltage signal variations without attenuation are passed from the cathode of the picture display tube 9 to the feedback signal input 21 by means of a level shift circuit. The level shift is obtained by means of a pulse signal of constant amplitude which is fed to an input 39 and whose positive part is clamped on the black level via a capacitor 41 and a diode 43 at the moment the black level in the signal at the cathode is produced. By means of a smoothing circuit formed by a resistor 45 and a capacitor 47 the black level which is shifted over the average value of the negative-going part of the pulse signal is supplied, via a separating resistor 49 to the feedback signal input 21 so that a very strong feedback of variations in the black level is obtained. The junction of the resistor 45, the diode 43 and the capacitor 41 is connected to the positive voltage via a resistor 51 to enable the transfer of a possible variation in the black level also in a positive direction.

The resistors 25, 17, 19 and 20 constitute a voltage divider which, in unloaded state produce approximately half the voltage which is found across the ends at the junction to the cathode. Owing to this choice a minimum dissipation is obtained for the two transistors 7 and 11 in the stable state.

The pre-amplifier 3 comprises a provision for the supply of output signals which may possibly go negative with respect to earth without the amplifier being supplied with a negative supply voltage. A negative signal voltage can be generated across a resistor 53 between the base of the transistor 7 and the output 5 of the pre-amplifier 3, as the output 5 is connected to a positive supply voltage via a parallel circuit of a zener diode 55 and a capacitor 57 connected to the junction of the collector of a transistor 59 and a resistor 61. The transistor 59 forms with a further transistor 63 an emitter-coupled difference amplifier pair. The base of the transistor 59 is connected to the input 1, that of the transistor 63 to the feedback signal input 21. The coupled emitters are supplied with power via a power supply source having a transistor 65 and a resistor 67.

The bias voltage provision having the resistor 33 the diode 31 and the capacitor 35 may be common for the three amplifiers of a colour television receiver having three video amplifiers.

The amplifier shown in the example of FIG. 2 can in a particularly easy way be made suitable for the control of a wehnelt electrode by reversing the polarity of the input signal and by adapting the amplitude of the pulse signal supplied to the input 39 to the new desired black level.

During recharging of the capacitor 41 the pulses at the input 39 produce at the cathode of the picture display tube 9 positive voltage pulses which appear with the same polarity at the base of the transistor 7 via the AC voltage feedback and consequently automatically cancel any extra charge of the capacitor 15.

It is possible to control the base of the transistor 7 also via a capacitor if this base is connected to earth via a clamping diode or connected to a very low positive potential which can also be applied by means of a current-carrying diode.

What is claimed is:

1. A video output stage for a television display tube having a control electrode, said stage comprising a video amplifier comprising a pair of active elements including output electrodes having a high output impedance and control electrodes, said output electrodes being coupled to one another and adapted to be coupled to said control electrode of said picture display tube, a first capacitor means for applying a signal of high video frequencies only to one of said element control electrodes, the elements comprising a complementary pair of transistors which are coupled in series and have emitter, base, and collector electrodes, said last two recited electrodes being said control and output electrodes respectively, said collectors being adapted to be coupled to the control electrode of the picture display tube, the base of one of the transistors being controlled by said capacitor, a first diode means coupled to said capacitor controlled base and to a potential source for providing that in the absence of a signal substantially no direct current flows through this transistor, the polarity of the diode being that after a possible change in the charge of the capacitor due to a signal jump which has rendered the base-emitter junction of the transistor conductive the said change in charge can be cancelled by an opposite signal jump which renders the diode conductive, the quiescent state of the other transistor being also substantially current-less, and a voltage feedback means from an output of the amplifier to an input.

2. A stage as claimed in claim 1, wherein the potential source comprises a current-carrying diode coupled to the emitter of the transistor which is controlled by the capacitor.

3. A stage as claimed in claim 1, further comprising a resistor means for coupling the collectors of the transistors to the control electrode of the picture display tube and for reducing the collector dissipation of the transistors while the excitability of the transistors is only slightly reduced.

4. A stage as claimed in claim 1, further comprising a voltage divider coupled between said emitters and also to said collectors, said divider comprising two resistors of substantially equal values.

5. A stage as claimed in claim 1, wherein the voltage feedback means includes a combination of an AC voltage feedback circuit and a DC voltage circuit means for clamping the black level.

6. A stage as claimed in claim 5, further comprising a second diode coupled at one end to the junction of the collector circuits of the transistors and the control electrode of the picture display tube, a second capacitor means coupled to the other end of said second diode for applying a clamping pulse so that the second diode conducts during the occurrence of the clamping pulses, and the AC voltage feedback circuit comprises means for supplying a pulse of such a polarity to the said first capacitor that the said first diode conducts.

7. A television display apparatus comprising a video output stage as claimed in claim 1.

* * * * *